(12) United States Patent
Nagami et al.

(10) Patent No.: US 10,431,433 B2
(45) Date of Patent: Oct. 1, 2019

(54) PLASMA PROCESSING APPARATUS AND PLASMA PROCESSING METHOD

(71) Applicant: TOKYO ELECTRON LIMITED, Tokyo (JP)

(72) Inventors: Koichi Nagami, Miyagi (JP); Natsumi Torii, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/003,954

(22) Filed: Jun. 8, 2018

(65) Prior Publication Data

US 2018/0366305 A1 Dec. 20, 2018

(30) Foreign Application Priority Data

Jun. 14, 2017 (JP) .................. 2017-116950

(51) Int. Cl.
*H01J 37/32* (2006.01)

(52) U.S. Cl.
CPC .. *H01J 37/32642* (2013.01); *H01J 37/32091* (2013.01); *H01J 37/3299* (2013.01); *H01J 37/32385* (2013.01); *H01J 37/32697* (2013.01); *H01J 2237/24564* (2013.01)

(58) Field of Classification Search
CPC ........... H01J 21/31116; H01J 37/32165; H01J 37/32174; H01J 37/32183; H01J 37/32082; H01J 37/32091; H01J 37/32

USPC .............. 156/345.28, 345.1, 345.29, 345.24, 156/345.34

See application file for complete search history.

(56) References Cited

U.S. PATENT DOCUMENTS

2009/0026170 A1* 1/2009 Tanaka .............. H01J 37/32091
216/60

FOREIGN PATENT DOCUMENTS

JP 2008-227063 A 9/2008

* cited by examiner

*Primary Examiner* — Wei (Victor) Chan
(74) *Attorney, Agent, or Firm* — Rothwell, Figg, Ernst & Manbeck, P.C.

(57) ABSTRACT

In a plasma processing apparatus, a controller controls one or both of a first high frequency power supply and a second high frequency power supply to periodically stop the supply of one or both of the first high frequency power and the second high frequency power. The controller also controls a switching unit to apply a DC voltage to a focus ring from a first time after a predetermined period of time in which a self-bias voltage of a lower electrode is decreased from a start point of each period in which one or both of the first high frequency power and the second high frequency power are supplied and to stop the application of the DC voltage to the focus ring during each period in which the supply of one or both of the first high frequency power and the second high frequency power is stopped.

12 Claims, 13 Drawing Sheets

PLASMA PROCESSING APPARATUS AND PLASMA PROCESSING METHOD

CROSS-REFERENCE TO RELATED APPLICATIONS

This application claims priority to Japanese Patent Application No. 2017-116950 filed on Jun. 14, 2017, the entire contents of which are incorporated herein by reference.

FIELD OF THE INVENTION

The present disclosure relates to a plasma processing apparatus and a plasma processing method.

BACKGROUND OF THE INVENTION

In manufacturing electronic devices, plasma processing is performed to process a substrate. The plasma processing is performed by a plasma processing apparatus. The plasma processing apparatus generally includes a chamber main body, a stage, a first high frequency power supply, and a second high frequency power supply. The chamber main body defines an inner space as a chamber. The stage is provided in the chamber. The stage includes a lower electrode and an electrostatic chuck. The electrostatic chuck is provided on the lower electrode. The first high frequency power supply supplies a first high frequency power to generate plasma of a gas in the chamber. The second high frequency power supply supplies a second high frequency bias power to the lower electrode. A focus ring is provided on the stage to surround an edge of the substrate mounted on the electrostatic chuck. The focus ring is provided to allow ions to be incident on the substrate perpendicularly to the substrate.

The focus ring is consumed as the plasma processing time is increased. When the focus ring is consumed, a thickness of the focus ring is decreased. When the thickness of the focus ring is decreased, a shape of a sheath above the focus ring and an edge region of the substrate is changed. When the shape of the sheath is changed, a direction of ions incident on the edge region of the substrate is inclined with respect to a vertical direction. As a result, an opening formed at the edge region of the substrate is inclined with respect to a thickness direction of the substrate.

In order to form an opening extending in parallel to the thickness direction of the substrate in the edge region of the substrate, it is required to correct the inclination of the incident direction of ions to the edge region of the substrate by controlling the shape of the sheath above the focus ring and the edge region of the substrate. There has been developed a plasma processing apparatus configured to apply a negative DC voltage to the focus ring to control the shape of the sheath above the focus ring and the edge region of the substrate. Such a plasma processing apparatus is described in, e.g., Japanese Patent Application Publication No. 2008-227063.

In the plasma processing, supply and stop of supply of one or both of a first high frequency and a second high frequency may be alternately switched. In this plasma processing as well, it is required to correct the inclination of the incident direction of ions to the edge region of the substrate. Also, it is required to suppress electric discharge between the substrate and the focus ring.

SUMMARY OF THE INVENTION

In accordance with an aspect, there is provided a plasma processing apparatus includinging a chamber main body, a stage, a first high frequency power supply, a second high frequency power supply, a DC power supply, a switching unit and a controller. The chamber main body defines an inner space as a chamber. The stage includes a lower electrode and an electrostatic chuck provided on the lower electrode, and a focus ring is arranged on the stage to surround a substrate mounted on the electrostatic chuck. The first high frequency power supply is configured to supply a first high frequency power for generating plasma of a gas in the chamber. The second high frequency power supply is configured to supply a second high frequency bias power to the lower electrode. The DC power supply is configured to generate a negative DC voltage to be applied to the focus ring in order to correct inclination of an incident direction of ions to an edge region of the substrate mounted on the electrostatic chuck with respect to a vertical direction. The switching unit is configured to stop the application of the DC voltage to the focus ring. The controller is configured to control one or both of the high frequency power supply and the second high frequency power supply and control the switching unit. The controller controls one or both of the first high frequency power supply and the second high frequency power supply to periodically stop the supply of one or both of the first high frequency power and the second high frequency power. Further, the controller controls the switching unit to apply the DC voltage to the focus ring from a first time after a predetermined period of time in which a self-bias voltage of the lower electrode is decreased from a start point of each period in which one or both of the first high frequency power and the second high frequency power are supplied and to stop the application of the DC voltage to the focus ring during each period in which the supply of one or both of the first high frequency power and the second high frequency power is stopped.

In accordance with another aspect, there is provided a plasma processing method. The plasma processing method is performed in a state where a substrate is mounted on the electrostatic chuck and a processing gas is supplied into the chamber. The plasma processing method includes: (i) supplying one or both of the first high frequency power and the second high frequency power; and (ii) stopping the supply of one or both of the first high frequency power and the second high frequency power. In the supplying one or both of the first high frequency power and the second high frequency power and the stopping the supply of one or both of the first high frequency power and the second high frequency power are alternately executed. The plasma processing method includes: (iii) applying the DC voltage to the focus ring from a first time after a predetermined period of time in which a self-bias voltage of the lower electrode is decreased from a start point of each period in which one or both of the first high frequency power and the second high frequency power are supplied; and (iv) stopping the application of the DC voltage to the focus ring during each period in which the supply of one or both of the first high frequency power and the second high frequency power is stopped.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Figure 1:
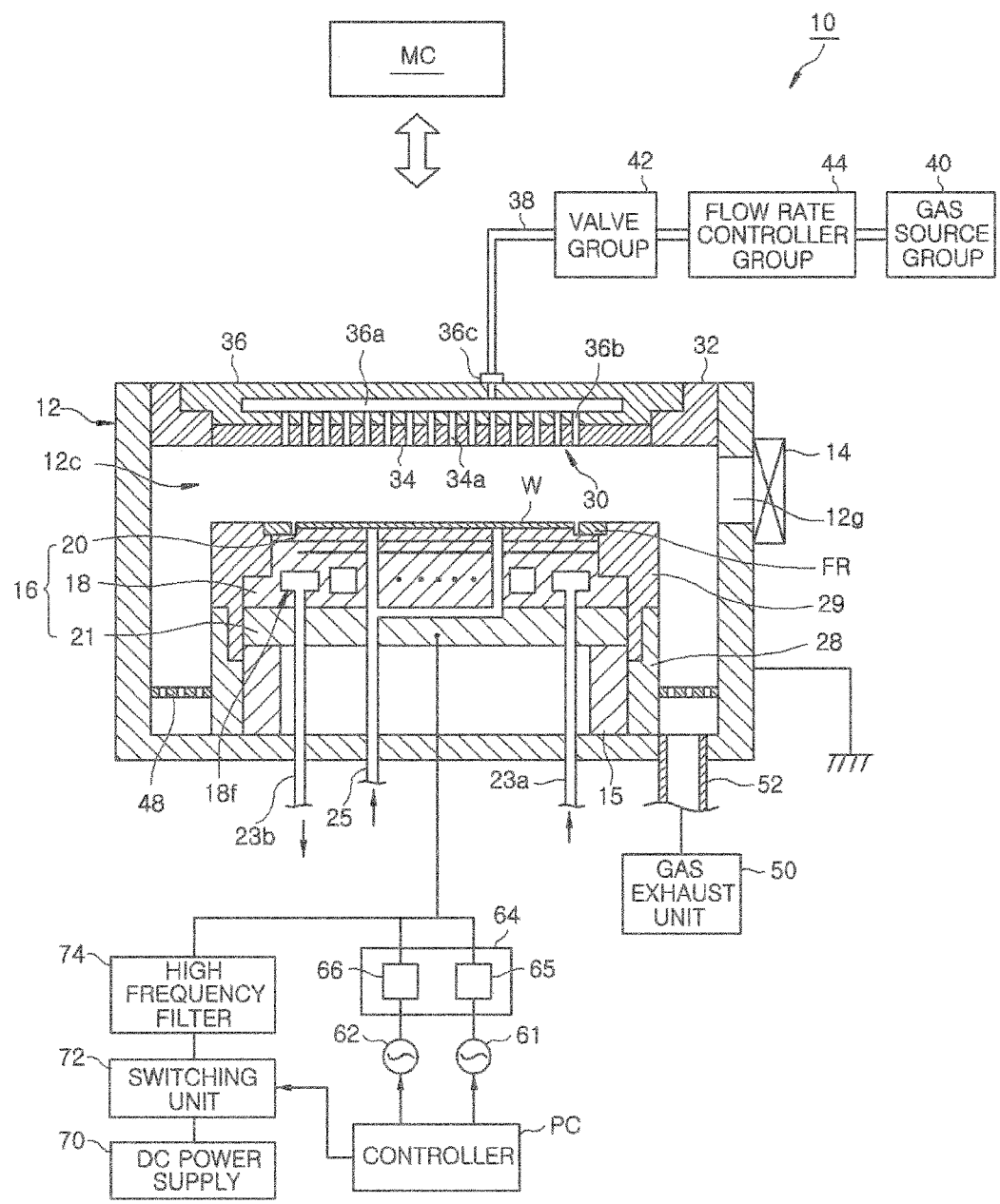
FIG. 1 schematically shows a plasma processing apparatus according to an embodiment.

Hereinafter, various embodiments will be described in detail with reference to the accompanying drawings. Like reference numerals will be given to like or corresponding parts throughout the drawings.

Figure 2:
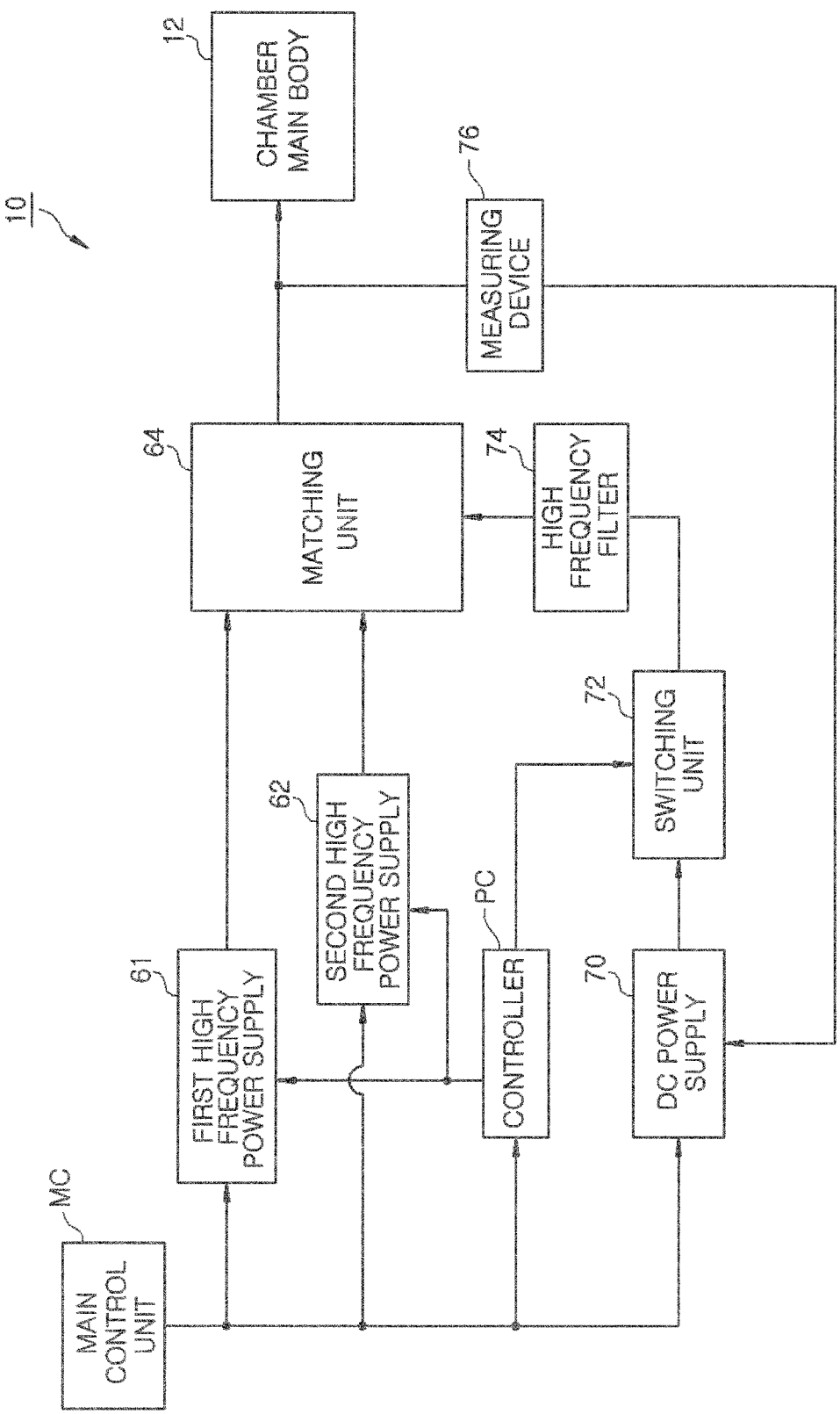
FIG. 2 shows an embodiment of a power supply system and a control system of the plasma processing apparatus shown in FIG. 1.

FIG. 1 schematically shows a plasma processing apparatus according to an embodiment. FIG. 2 shows an embodiment of a power supply system and a control system of the plasma processing apparatus shown in FIG. 1. A plasma processing apparatus 10 shown in FIG. 1 is a capacitively coupled plasma processing apparatus.

The plasma processing apparatus 10 includes a chamber main body 12. The chamber main body 12 has a substantially cylindrical shape. The chamber main body 12 defines an inner space as a chamber 12c. The chamber main body 12 is made of, e.g., aluminum. The chamber main body 12 is connected to a ground potential. A plasma resistant film is formed on an inner wall surface of the chamber main body 12, i.e., a wall surface defining the chamber 12c. The film may be a film formed by anodic oxidation treatment or a ceramic film such as a film made of yttrium oxide. A passage 12g is formed in a sidewall of the chamber main body 12. When the substrate W is loaded into the chamber 12c and unloaded from the chamber 12c, the substrate W passes through the passage 12g. A gate valve 14 is provided at the sidewall of the chamber main body 12 to open and close the passage 12g.

In the chamber 12c, a supporting portion 15 extends upward from a bottom portion of the chamber main body 12. The supporting portion 15 has a substantially cylindrical shape and is made of an insulating material such as quartz.

A stage 16 is mounted on the supporting portion 15 and supported by the supporting portion 15. The stage 16 is configured to support the substrate W in the chamber 12c. The stage 16 includes a lower electrode 18 and an electrostatic chuck 20. In one embodiment, the stage 16 further includes an electrode plate 21. The electrode plate 21 is made of a conductive material such as aluminum and has a substantially disc shape. The lower electrode 18 is provided on the electrode plate 21. The lower electrode 18 is formed of a conductive material such as aluminum and has a substantially disc shape. The lower electrode 18 is electrically connected to the electrode plate 21.

A flow path 18f is provided in the lower electrode 18. The flow path 18f is used for a heat exchange medium. As for the heat exchange medium, a liquid coolant or a coolant (e.g., Freons) for cooling the lower electrode 18 by vaporization thereof is used. The heat exchange medium is supplied to the flow path 18f from a chiller unit (not shown) provided outside the chamber main body 12 through a line 23a. The heat exchange medium supplied to the flow path 18f is returned to the chiller unit through a line 23b. In this manner, the heat exchange medium is supplied to the flow path 18f and circulates between the flow path 18f and the chiller unit.

The electrostatic chuck 20 is provided on the lower electrode 18. The electrostatic chuck 20 includes a main body made of an insulator and a film-shaped electrode provided in the main body. A DC power supply (not shown) is electrically connected to the electrode of the electrostatic chuck 20. When a voltage is applied from the DC power supply to the electrode of the electrostatic chuck 20, an electrostatic attractive force is generated between the substrate W mounted on the electrostatic chuck 20 and the electrostatic chuck 20. Due to the electrostatic attractive force thus generated, the substrate W is attracted to the electrostatic chuck 20 and held on the electrostatic chuck 20.

The plasma processing apparatus 10 further includes a gas supply line 25. The gas supply line 25 supplies a heat transfer gas, e.g., He gas, from a gas supply unit (not shown) to a gap between an upper surface of the electrostatic chuck 20 and a backside (bottom surface) of the substrate W.

A cylindrical portion 28 extends upward from the bottom portion of the chamber main body 12. The cylindrical portion 28 extends along an outer periphery of the supporting portion 15. The cylindrical portion 28 is made of a conductive material and has a substantially cylindrical shape. The cylindrical portion 28 is connected to the ground potential. An insulating portion 29 is provided on the cylindrical portion 28. The insulating portion 29 has insulating properties and is made of ceramic such as quartz. The insulating portion 29 has a substantially cylindrical shape and extends along an outer periphery of the electrode plate 21, an outer periphery of the lower electrode 18, and an outer periphery of the electrostatic chuck 20.

Figure 3:
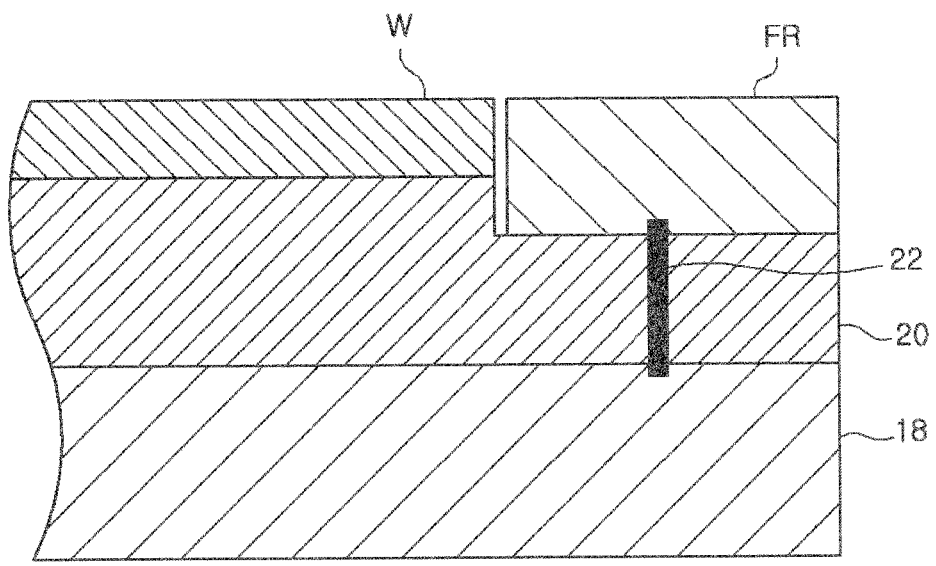
FIG. 3 shows a partially enlarged cross sectional view of a stage and a focus ring shown in FIG. 1.

A focus ring FR is provided on an outer peripheral region of the electrostatic chuck 20. The focus ring FR has a substantially annular plate shape, and is made of, e.g., silicon. The focus ring FR is disposed to surround the edge of the substrate W. FIG. 3 shows a partially enlarged cross sectional view of the stage 16 and the focus ring FR shown in FIG. 1. As shown in FIG. 3, in one embodiment, the focus ring FR is electrically connected to the lower electrode 18 through a conductor 22. The conductor 22 penetrates through the electrostatic chuck 20.

The plasma processing apparatus 10 further includes an upper electrode 30. The upper electrode 30 is provided above the stage 16. The upper electrode 30 closes an upper opening of the chamber main body 12 together with a member 32. The member 32 has insulating properties. The upper electrode 30 is supported at an upper portion of the chamber main body 12 through the member 32. As will be described later, when the first high frequency power supply 61 is electrically connected to the lower electrode 18, the upper electrode 30 is connected to the ground potential.

The upper electrode 30 includes a top plate 34 and a holding body 36. A bottom surface of the top plate 34 defines the chamber 12c. The top plate 34 is provided with a plurality of gas injection holes 34a. The gas injection holes 34a penetrate through the top plate 34 in a plate thickness direction (vertical direction). The top plate 34 is made of, e.g., silicon, but is not limited thereto. Alternatively, the top plate 34 may have a structure in which a plasma resistant film is formed on a surface of an aluminum base. The film may be a film formed by anodic oxidation treatment or a ceramic film such as a film made of yttrium oxide.

The holding body 36 detachably holds the top plate 34. The holding body 36 may be made of a conductive material, e.g. aluminum. A gas diffusion space 36a is provided inside the holding body 36. A plurality of gas holes 36b extends downward from the gas diffusion space 36a. The gas holes 36b communicate with the gas injection holes 34a. A gas inlet port 36c for introducing a gas into the gas diffusion space 36a is formed in the holding body 36. A gas supply line 38 is connected to the gas inlet port 36c.

A gas source group 40 is connected to the gas supply line 38 through a valve group 42 and a flow rate controller group 44. The gas source group 40 includes a plurality of gas sources. The valve group 42 includes a plurality of valves. The flow rate controller group 44 includes a plurality of flow rate controllers. Each of the flow rate controllers of the flow rate controller group 44 is a mass flow controller or a pressure control type flow rate controller. The gas sources of the gas source group 40 are connected to the gas supply line 38 through the corresponding valves of the valve group 42 and the corresponding flow rate controllers of the flow rate control group 44. The plasma processing apparatus 10 can supply gases from one or more gas sources selected among the plurality of gas sources of the gas source group 40 to the chamber 12c at individually controlled flow rates.

A baffle plate 48 is provided between the cylindrical portion 28 and the sidewall of the chamber main body 12. The baffle plate 48 may be formed by coating ceramic such as yttrium oxide or the like on an aluminum base, for example. A plurality of through-holes is formed in the baffle plate 48. Below the baffle plate 48, a gas exhaust line 52 is connected to the bottom portion of the chamber main body 12. A gas exhaust unit 50 is connected to the gas exhaust line 52. The gas exhaust unit 50 includes a pressure controller such as an automatic pressure control valve and a vacuum pump such as a turbo molecular pump or the like, and thus can decrease a pressure in the chamber 12c.

As shown in FIGS. 1 and 2, the plasma processing apparatus 10 further includes a first high frequency power supply 61. The first high frequency power supply 61 generates a first high frequency power for plasma generation. The first high frequency power has a frequency within a range of 27 MHz to 100 MHz, e.g., 60 MHz. The first high frequency power supply 61 is connected to the lower electrode 18 via a first matching circuit 65 of a matching unit 64 and the electrode plate 21. The first matching circuit 65 matches an output impedance of the first high frequency power supply 61 and an impedance of a load side (the lower electrode 18 side). The first high frequency power supply 61 may not be electrically connected to the lower electrode 18, and may be connected to the upper electrode 30 via the first matching circuit 65.

The plasma processing apparatus 10 further includes a second high frequency power supply 62. The second high frequency power supply 62 generates a second high frequency bias power for attracting ions into the substrate W. The frequency of the second high frequency power is lower than the frequency of the first high frequency power. The frequency of the second high frequency is within a range of 400 kHz to 13.56 MHz, e.g. 400 kHz. The second high frequency power supply 62 is connected to the lower electrode 18 via a second matching circuit 66 of the matching unit 64 and the electrode plate 21. The second matching circuit 66 matches an output impedance of the second high frequency power supply 62 and the impedance of the load side (the lower electrode 18 side).

The plasma processing apparatus 10 further includes a DC power supply 70 and a switching unit 72. The DC power supply 70 generates a negative DC voltage to be applied to the focus ring FR. The DC power supply 70 is connected to the switching unit 72. The switching unit 72 is electrically connected to the lower electrode 18 via a high frequency filter 74. In one embodiment, the lower electrode is electrically connected to the focus ring FR. Therefore, the DC power supply 70 is electrically connected to the focus ring FR through the switching unit 72, the high frequency filter 74, and the lower electrode 18.

The plasma processing apparatus 10 further includes a controller PC. The controller PC is configured to control one or both of the first high frequency power supply 61 and the second high frequency power supply 62, and the switching unit 72. In one embodiment, both of the supply of the first high frequency power and that of the second high frequency power are periodically stopped. In this embodiment, the controller PC controls both of the first high frequency power supply 61 and the second high frequency power supply 62 and the switching unit 72. In another embodiment, only one of the supply of the first high frequency power and the supply of the second high frequency power is periodically stopped. In this embodiment, the controller PC is configured to control the corresponding high frequency power supply between the first high frequency power supply 61 and the second high frequency power supply 62, and the switching unit 72.

In one embodiment, the plasma processing apparatus 10 may further include a main control unit MC. The main control unit MC is a computer including a processor, a storage device, an input device, a display device and the like, and controls the respective components of the plasma processing apparatus 10. Specifically, the main control unit MC executes a control program stored in the storage device, and controls the respective components of the plasma processing apparatus 10 based on recipe data stored in the storage device. Accordingly, the plasma processing apparatus 10 executes a process specified by the recipe data.

Figure 4:
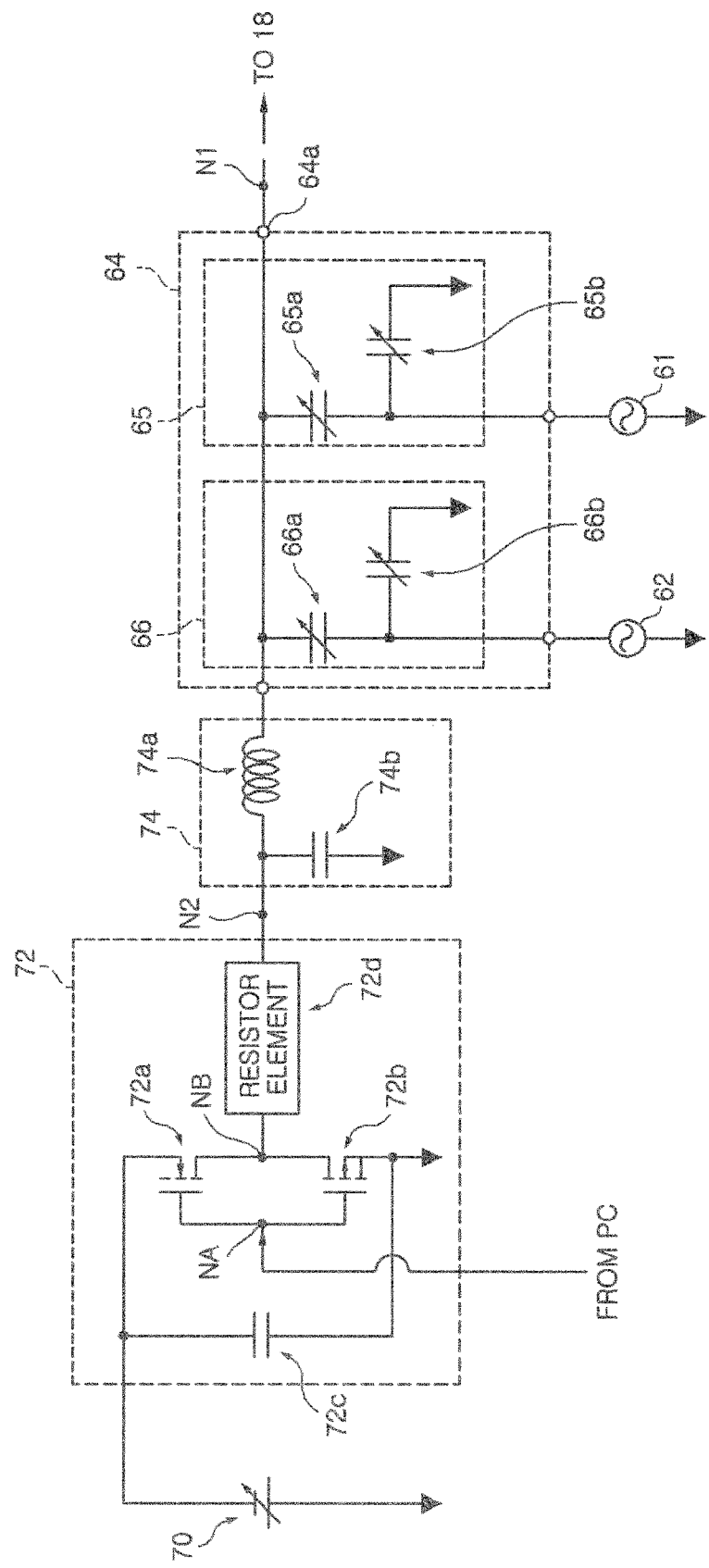
FIG. 4 shows circuit configurations of a DC power supply, a switching unit, a high frequency filter, and a matching unit shown in FIG. 2.

Hereinafter, FIGS. 2 and 4 will be referred to. FIG. 4 shows circuit configurations of the DC power supply 70, the switching unit 72, the high frequency filter 74, and the matching unit 64 shown in FIG. 2. The DC power supply 70 is a variable DC power supply and generates a negative DC voltage to be applied to the focus ring FR.

The switching unit 72 can stop the application of the DC voltage from the DC power supply 70 to the focus ring FR. In one embodiment, the switching unit 72 includes a field effect transistor (FET) 72a, a FET 72b, a capacitor 72c, and a resistor element 72d. The FET 72a is, e.g., an N channel MOSFET. The FET 72*b* is, e.g., a P channel MOSFET. A source of the FET 72*a* is connected to a negative electrode of the DC power supply 70. One end of the capacitor 72*c* is connected to the negative electrode of the DC power supply and the source of the FET 72*a*. The other end of the capacitor 72*c* is connected to a source of the FET 72*b*. The source of the FET 72*b* is connected to the ground. A gate of the FET 72*a* and a gate of the FET 72*b* are connected to each other. A pulse control signal from the controller PC is supplied to a node NA connected between the gate of the FET 72*a* and the gate of the FET 72*b*. A drain of the FET 72*a* is connected to a drain of the FET 72*b*. A node NB connected to the drain of the FET 72*a* and the drain of the FET 72*a* is connected to the high frequency filter 74 through the resistance element 72*d*.

The high frequency filter 74 reduces or blocks the high frequency. In one embodiment, the high frequency filter 74 includes an inductor 74*a* and a capacitor 74*b*. One end of the inductor 74*a* is connected to the resistance element 72*d*. One end of the capacitor 74*b* is connected to one end of the inductor 74*a*. The other end of the capacitor 74*b* is connected to the ground. The other end of the inductor 74*a* is connected to the matching unit 64.

The matching unit 64 includes a first matching circuit 65 and a second matching circuit 66. In one embodiment, the first matching circuit 65 has a variable capacitor 65*a* and a variable capacitor 65*b*, and the second matching circuit 66 has a variable capacitor 66*a* and a variable capacitor 66*b*. One end of the variable capacitor 65*a* is connected to the other end of the inductor 74*a*. The other end of the variable capacitor 65*a* is connected to the first high frequency power supply 61 and one end of the variable capacitor 65*b*. The other end of the variable capacitor 65*b* is connected to the ground. One end of the variable capacitor 66*a* is connected to the other end of the inductor 74*a*. The other end of the variable capacitor 66*a* is connected to the second high frequency power supply 62 and one end of the variable capacitor 66*b*. The other end of the variable capacitor 66*b* is connected to the ground. One end of the variable capacitor 65*a* and one end of the variable capacitor 66*a* are connected to a terminal 64*a* of the matching unit 64. The terminal 64*a* of the matching unit 64 is connected to the lower electrode 18 through the electrode plate 21.

Figure 5:
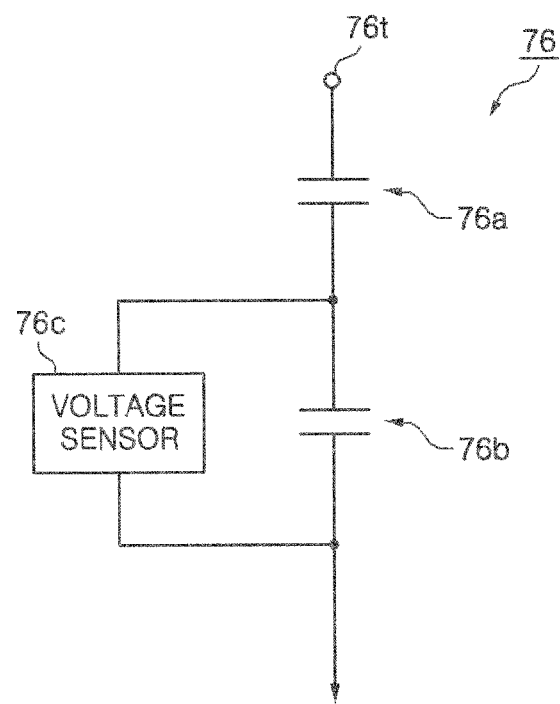
FIG. 5 showing an example of a measuring device that can be employed in the plasma processing apparatus shown in FIG. 1.

The plasma processing apparatus 10 further includes a measuring device 76. FIG. 5 shows an example of a measuring device that can be employed in the plasma processing apparatus shown in FIG. 1. The measuring device 76 is configured to measure a self-bias voltage of the lower electrode 18 (or a self-bias voltage of the substrate W). In one embodiment, as shown in FIG. 5, the measuring device has a capacitor 76*a*, a capacitor 76*b*, and a voltage sensor 76*c*. The capacitor 76*a* and the capacitor 76*b* are connected in series between a terminal 76*t* and the ground. The terminal 76*t* is connected to one of nodes N1 and N2 shown in FIG. 4. The node N1 is disposed between the lower electrode 18 and the terminal 64*a* of the matching unit 64. The node N2 is disposed between the switching unit 72 and the high frequency filter 74. A voltage of the node N1 and a voltage of the node N2 become substantially the same as the self-bias voltage of the lower electrode 18 when the DC voltage from the DC power supply 70 is not applied to the focus ring FR. The measuring device 76 can measure the self-bias voltage by dividing the voltage at the nodes and measuring the divided voltage.

Figure 6:
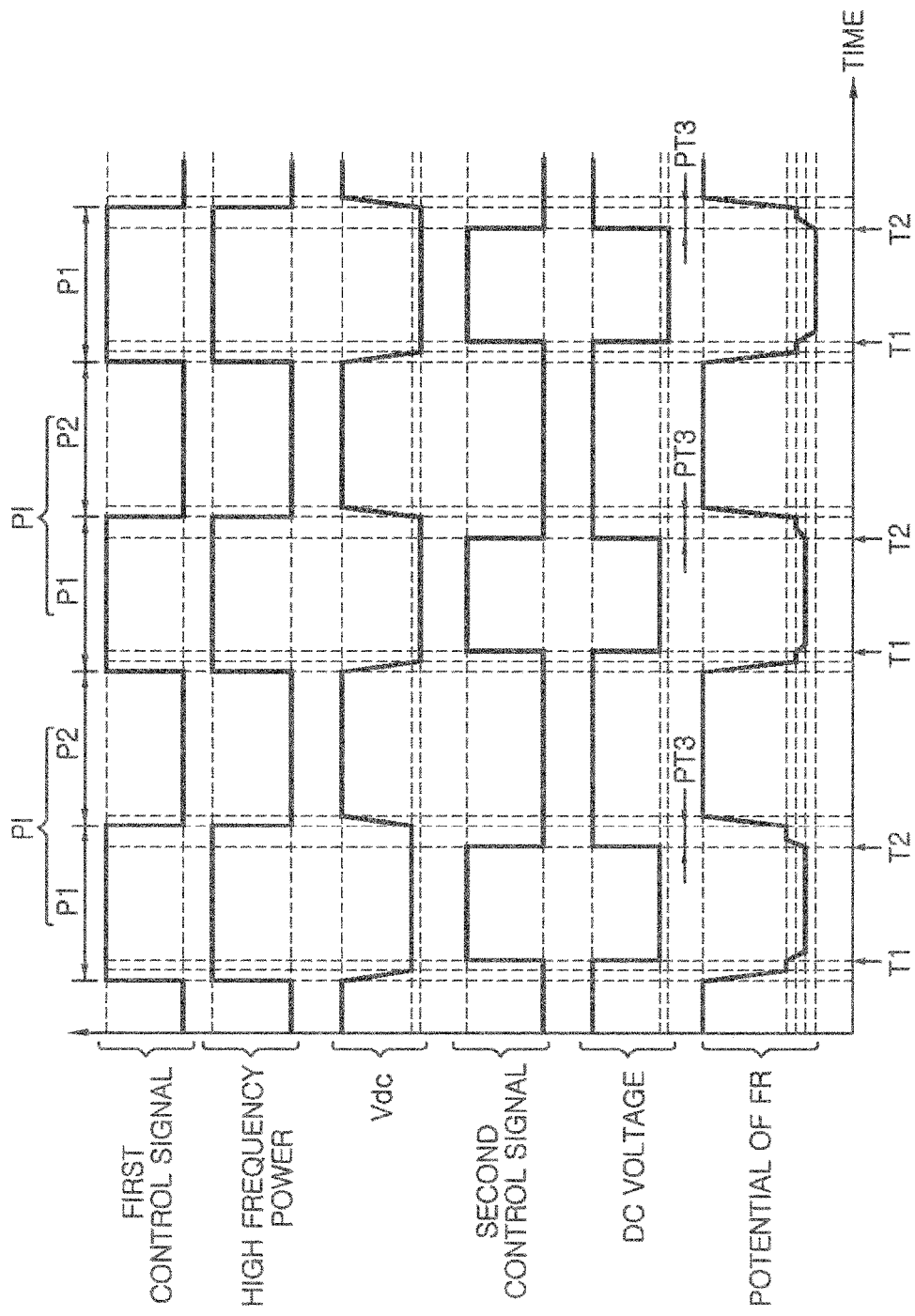
FIG. 6 is a timing chart related to plasma processing performed by using the plasma processing apparatus shown in FIG. 1.

Hereinafter, the control using the main control unit MC and the controller PC will be described. In the following description, FIGS. 2 and 6 will be referred to. FIG. 6 is a timing chart related to plasma processing performed by using the plasma processing apparatus shown in FIG. 1. In FIG. 6, the horizontal axis represents time and the vertical axis represents a first control signal outputted by the controller PC, a high frequency power (one or both of the first high frequency power and the second high frequency power), a self-bias voltage Vdc of the lower electrode 18 (or the substrate W), a second control signal outputted by the controller PC, a DC voltage applied from the DC power supply 70 to the focus ring FR, and a potential of the focus ring FR.

In the timing chart of the high frequency power in FIG. 6, a high level of the high frequency power indicates that one or both of the first high frequency power and the second high frequency power are supplied, and a low level of the high frequency power level indicates that the supply of one or both of the first high frequency power and the second high frequency power is stopped. Further, in the timing chart of the high frequency power in FIG. 6, a low level of the DC voltage indicates that a DC voltage is applied from the DC power supply 70 to the focus ring FR, and a high level of the DC voltage indicates that no DC voltage is applied from the DC power supply 70 to the focus ring FR.

As described above, the controller PC periodically stops the supply of one or both of the first high frequency power and the second high frequency power. In other words, the controller PC periodically stops the supply of one or both of the first high frequency power and the second high frequency power. When the supply of both of the first high frequency power and the second high frequency power is periodically stopped, the high frequency power in FIG. 6 represents both of the first high frequency power and the second high frequency power. When the supply of only one of the first high frequency power and the second high frequency power is periodically stopped, the high frequency power in FIG. 6 represents the corresponding one of the first high frequency power and the second high frequency power. When the supply of only one of the high frequency powers is periodically stopped, the other high frequency power may be continuously supplied or may not be used.

The DC power supply 70 sets the DC voltage applied to the focus ring FR to a negative voltage whose absolute value is the sum of the self-bias voltage Vdc and a set value $\Delta V$, i.e., $-(|Vdc|+\Delta V)$. The self-bias voltage Vdc is a self-bias voltage of the substrate W and also is a self-bias voltage of the lower electrode 18 in the case where one or both of the high frequency powers are supplied and the DC voltage from the DC power supply 70 is not applied to the lower electrode 18. The set value $\Delta V$ is given by the main control unit MC.

The main control unit MC is configured to specify the set value $\Delta V$ from the amount of consumption of the focus ring FR (the amount of decrease in the thickness of the focus ring FR from the initial thickness) and the self-bias voltage of the lower electrode 18 which is specified from the processing condition of the plasma processing, by using a predetermined function or table. In other words, the main control unit MC determines the set value $\Delta V$ by inputting the consumption amount of the focus ring FR and the self-bias voltage to the function or by referring to the table by using the consumption amount of the focus ring FR and the self-bias voltage.

In order to determine the set value $\Delta V$, the main control unit MC may use the set value while using a difference between the initial thickness of the focus ring FR and the thickness of the focus ring FR which is actually measured by a measuring device such as a laser measuring device as the consumption amount of the focus ring FR. Alternatively, in order to determine the setting value ΔV, the main control unit MC may determine the consumption amount of the focus ring FR from a specific parameter by using another predetermined function or table. The specific parameter may be any one of the self-bias voltage Vdc, a peak value Vpp of the first high frequency power or the second high frequency power, the load impedance, and the like. The another function or table is predetermined to determine the relation between the specific parameter and the consumption amount of the focus ring FR is determined. In order to determine the consumption amount of the focus ring FR, the plasma processing apparatus 10 operates under measurement conditions for determining the consumption amount, i.e., the first high frequency power, the second high frequency power, the pressure in the chamber 12c, the flow rates of one or more gases supplied to the chamber 12c, or the like, before the actual plasma processing or during the maintenance of the plasma processing apparatus 10. Further, the consumption amount of the focus ring FR is specified by obtaining the specific parameter and inputting the specific parameter to the another function or by referring to the another table by using the specific parameter.

The main control unit MC designates the power and the frequency of the first high frequency power to the first high frequency power supply 61. The power and the frequency of the first high frequency power generated by the first high frequency power supply 61 are respectively set to the power and the frequency which are designated by the main control unit MC to the first high frequency power supply 61. The main control unit MC specifies the power and the frequency of the second high frequency power to the second high frequency power supply 62. The power and the frequency of the second high frequency power generated by the second high frequency power supply 62 are respectively set to the power and the frequency which are designated by the main control unit MC to the second high frequency power supply 62.

The main control unit MC designates to the controller PC the frequency at which the supply of one or both of the first high frequency power and the second high frequency power is stopped. Further, the main control unit MC specifies a duty ratio to the controller PC. The duty ratio indicates a ratio of duration of a first period P1 in which one or both of the first high frequency power and the second high frequency power are supplied in one cycle PI (see FIG. 6) specified by the corresponding frequency. As shown in FIG. 6, one cycle PI includes the first period P1 and a second period P2 in which the supply of one or both of the first high frequency power and the second high frequency power is stopped.

The main control unit MC designates to the controller PC information specifying a first time T1 in each first period P1. At the first time T1, the application of the DC voltage to the focus ring FR by the DC power supply 70 is started. The first time T1 is later than the start point of each first period P1 and after a predetermined period of time in which the self-bias voltage of the lower electrode 18 is decreased. In other words, the first time T1 is a time after a period of time in which the self-bias voltage of the lower electrode 18 is decreased has elapsed from the start point of each first period P1.

In one embodiment, the main control unit MC specifies information specifying the second time T2 to the controller PC. At the second time T2, the application of the DC voltage from the DC power supply 70 to the focus ring FR, which is started at the first time T1 in each first period P1, is stopped. In one embodiment, the second time is later than the first time in each first period P1 and earlier than the end point thereof. The main control unit MC may transmit information specifying duration in which the application of the DC voltage from the DC power supply 70 to the focus ring FR is continued in each first period P1 to the controller PC, instead of the information specifying the second time.

The controller PC generates a first control signal based on the frequency and the duty ratio designated by the main control unit MC. The first control signal is a pulse signal having a high level in the first period P1 and a low level (or OFF level) in the second period P2. Alternatively, the first control signal may be a pulse signal having a low level (or OFF level) in the first period P1 and a high level in the second period P2. The first control signal may be transmitted from the controller PC to one or both of the high frequency power supplies. As can be seen from the timing chart of the high frequency power in FIG. 6, one or both of the high frequency power supplies supply one or both of the high frequency powers in each first period P1 specified from the first control signal and stop the supply of one or both of the high frequency powers in each second period P2 specified from the first control signal.

As can be seen from the timing chart of the self-bias voltage Vdc in FIG. 6, the self-bias voltage of the lower electrode 18 (or the substrate W) is a negative voltage having a high absolute value after the start time of each first period P1. Further, the self-bias voltage is a voltage having a low absolute value after the time at which the supply of one or both of the high frequency powers is stopped.

The controller PC generates the second control signal based on the frequency designated by the main control unit MC, the information specifying the first time and the information specifying the second time or the information specifying the duration. The second control signal is a pulse signal having a high level from the first time and having a low level from the second time in each first period P1. Alternatively, the second control signal may be a pulse signal having a low level from the first time and a high level from the second time in each first period P1. The controller PC provides the second control signal to the switching unit 72. Specifically, the second control signal is supplied to the node NA. Accordingly, as can be seen from the timing chart of the DC voltage in FIG. 6, the application of the DC voltage generated by the DC power supply 70 to the focus ring FR is started from the first time T1 in each first period P1. The application of the DC voltage generated by the DC power supply 70 to the focus ring FR is stopped from the second time T2. Therefore, as can be seen from the timing chart of the potential of the focus ring FR in FIG. 6, the absolute value of the potential of the focus ring FR is increased during a first transition period from the start point of each first period P1 to the first time T1 and further increased during a second transition period starting from the first time T1. The absolute value of the potential of the focus ring FR is decreased during a third transition period PT3 starting from the second time T2 and further decreased during a fourth transition period starting from the start point of each second period P2.

If the level of the second control signal transits at the first time T1 within each first period P1, the level thereof may not transit at the second time T2. In other words, the second control signal may be any pulse signal indicating the first time T1 within each first period P1. In this case, the information specifying the second time or the information specifying the duration may be transmitted to the switching unit 72 from the main control unit MC. The processor of the switching unit 72 can stop the application of the DC voltage from the DC power supply 70 to the focus ring FR based on the information specifying the second time or the information specifying the duration.

In one embodiment, the DC power supply 70 is configured to apply a DC voltage whose absolute value is the sum of the set value ΔV and an absolute value of the self-bias voltage Vdc measured by the measuring device 76 during a period between the second time T2 and the end point within each first period P1, i.e., during each third transition period PT3, within a next first period P1. The DC power supply 70 can employ the self-bias voltage Vdc having a minimum absolute value during each third transition period PT3 as the measurement value of the self-bias voltage Vdc.

Figure 7:
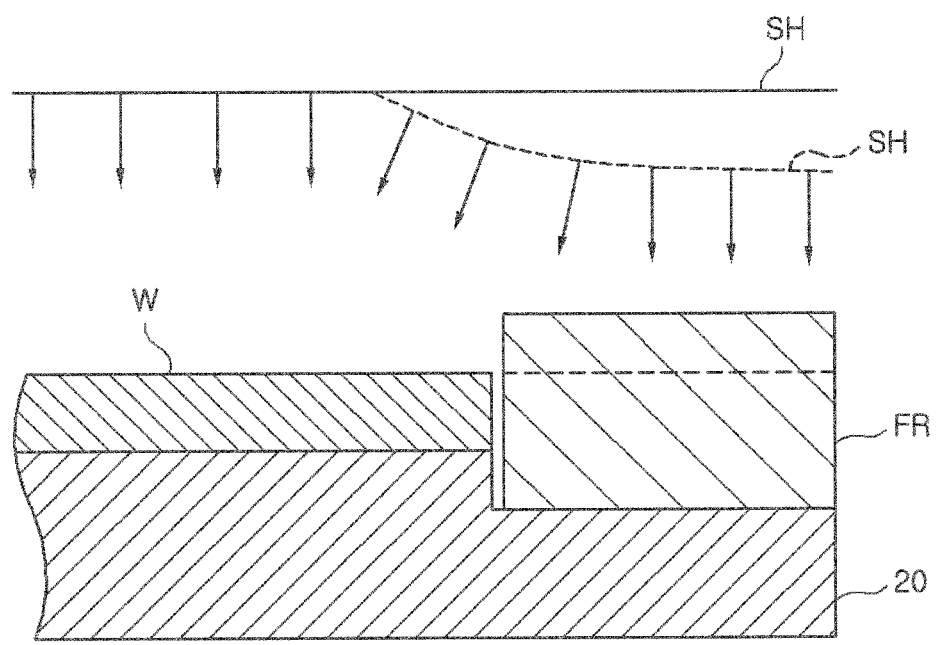
FIG. 7 shows a change in a shape of a sheath due to consumption of the focus ring and occurrence of inclination in the incident direction of ions.

Hereinafter, FIG. 7 will be referred to. FIG. 7 shows a change in the shape of the sheath due to consumption of the focus ring and occurrence of inclination in an incident direction of ions. The focus ring FR indicated by a solid line in FIG. 7 is the focus ring FR that is not consumed. The focus ring FR indicated by a dotted line in FIG. 7 is the focus ring FR whose thickness is decreased by consumption. In FIG. 7, the sheath SH indicated by a solid line has a shape in a state where the focus ring FR is not consumed. In FIG. 7, the sheath SH indicated by a dotted line has a shape in a state where the focus ring FR is consumed. In FIG. 7, arrows indicate the incident direction of ions in a state where the focus ring FR is consumed.

As shown in FIG. 7, when the focus ring FR is not consumed, the shape of the sheath SH is maintained in parallel above the substrate W and the focus ring FR. Therefore, ions are incident in a direction (vertical direction) substantially perpendicular to the entire surface of the substrate W. On the other hand, when the thickness of the focus ring FR is decreased by consumption, the shape of the sheath SH changes above the edge region of the substrate W and the focus ring FR. Accordingly, the incident direction of ions with respect to the edge region of the substrate W is inclined with respect to the vertical direction. Therefore, an opening inclined with respect to the thickness direction is formed in the edge region of the substrate W.

By using the plasma processing apparatus 10, it is possible to correct the inclination of the incident direction of ions due to the consumption of the focus ring FR. Specifically, in the plasma processing apparatus 10, the DC voltage from the DC power source 70 is applied to the focus ring FR during or after the period of time in which the self-bias potential of the lower electrode 18 is reduced in each first period P1 in which one or both of the first high frequency power and the second high frequency power are supplied. Accordingly, the shape of the sheath above the focus ring FR and the edge region of the substrate W is controlled, and the inclination of the incident direction of ions to the edge region of the substrate W is suppressed. Therefore, an opening that is substantially in parallel to the thickness direction of the substrate W is formed over the entire region of the substrate W. In each second period P2 in which the supply of one or both of the high frequency power is stopped, the absolute value of the self-bias voltage of the substrate W is decreased and the application of the DC voltage to the focus ring FR is stopped. Accordingly, a difference between the potential of the substrate W and the potential of the focus ring FR is reduced in each second period P2 in which the supply of one or both high frequency powers is stopped. As a result, the electric discharge between the substrate W and the focus ring FR is suppressed.

In one embodiment, the DC power supply 70 is configured to generate a DC voltage whose absolute value is the sum of the absolute value of the self-bias voltage Vdc measured by the measuring device 76 and the set value ΔV designated by the main control unit MC. The inclination of the incident direction of ions to the edge region of the substrate W with respect to the vertical direction depends on the amount of consumption of the focus ring FR and the self-bias voltage Vdc. This is because the shape of the sheath above the focus ring FR and the edge region of the substrate W depends on the amount of consumption of the focus ring FR and the sheath thickness. Therefore, the amount of increase in the absolute value of the DC voltage to be applied to the focus ring RF with respect to the absolute value of the self-bias voltage Vdc which is required to correct the inclination of the incident direction of ions to the edge region of the substrate W, i.e., the set value ΔV, also depends on the amount of consumption of the focus ring and the self-bias voltage Vdc. As described above, the function or the table used for specifying the set value ΔV is predetermined so that the amount of consumption of the focus ring FR and the self-bias voltage Vdc correspond to the set value ΔV. In this embodiment, the set value ΔV is obtained by using the function or the table so that the inclination of the incident direction of the ions to the edge region of the substrate W is suppressed.

In one embodiment, the self-bias voltage Vdc is measured by the measuring device 76 during a period between the second time T2 and the end point in each first period P1 in which one or both of the high frequency powers are supplied, i.e., during each third transition period PT3, and the DC voltage whose absolute value is the sum of the set value ΔV and the absolute value of the measured self-bias voltage Vdc is applied to the focus ring FR in a next first period P1 in which one or both of the high frequency powers are supplied. In this embodiment, the DC voltage applied to the focus ring FR is determined from the self-bias voltage Vdc measured during the plasma processing. Therefore, even if the self-bias voltage Vdc is changed, the DC voltage generated by the DC power supply 70 in the next first period P1 is corrected, and the incident direction of the ions is appropriately corrected.

Figure 8:
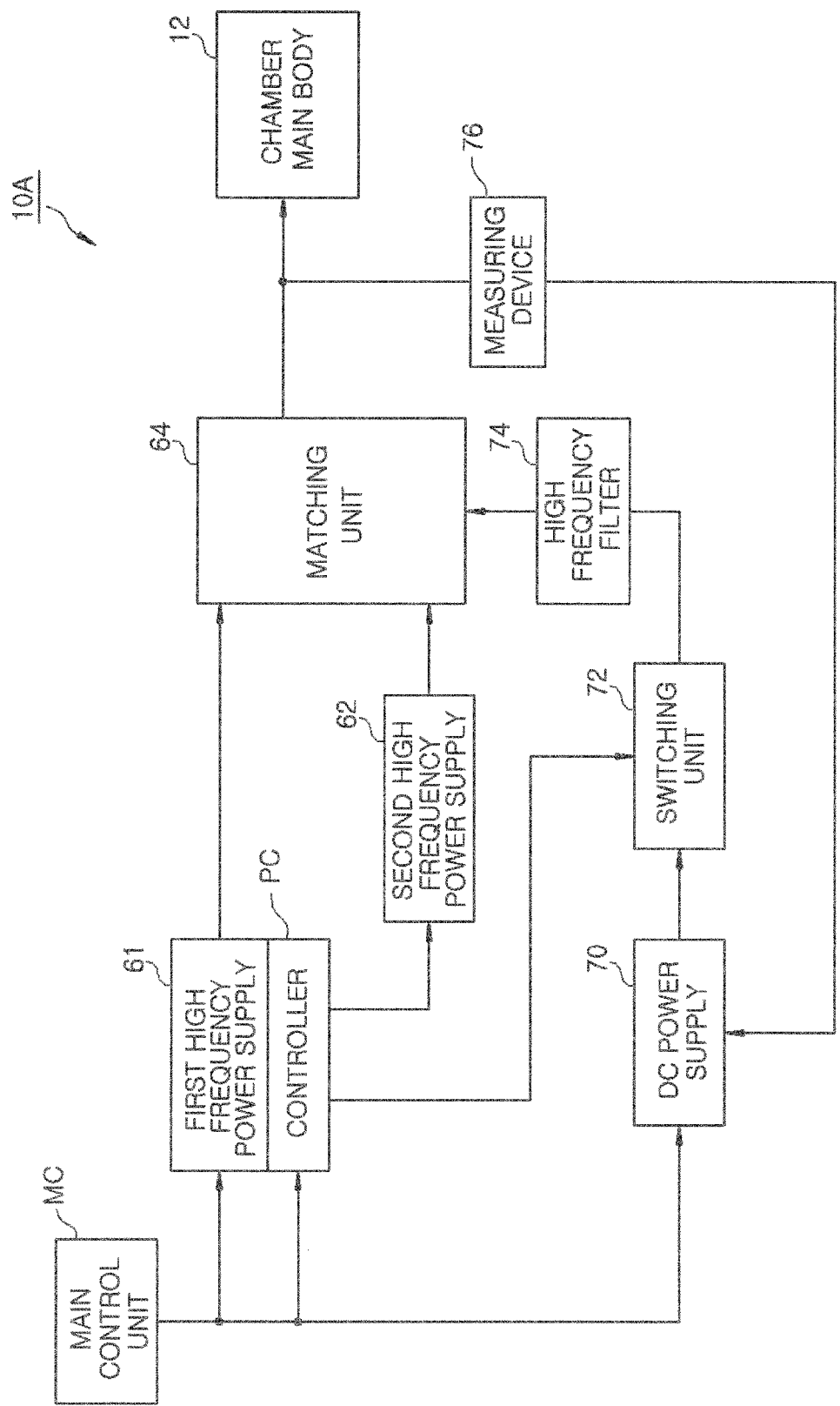
FIG. 8 showing a power supply system and a control system of a plasma processing apparatus according to another embodiment.

Hereinafter, another embodiment will be described. FIG. 8 shows a power supply system and a control system of a plasma processing apparatus according to another embodiment. As shown in FIG. 8, the plasma processing apparatus 10A according to another embodiment is different from the plasma processing apparatus 10 in that the first high frequency power supply 61 includes a controller PC. In other words, in the plasma processing apparatus 10A, the controller PC is a part of the first high frequency power supply 61. On the other hand, in the plasma processing apparatus 10, the controller PC is a separate component from the first high frequency power supply 61 and the second high frequency power supply 62. In the plasma processing apparatus 10A, the controller PC is a part of the first high frequency power supply 61 and, thus, the first control signal is not transmitted to the first high frequency power supply 61. The controller PC may not be a part of the first high frequency power supply 61 and may be a part of the second high frequency power supply 62.

Figure 9:
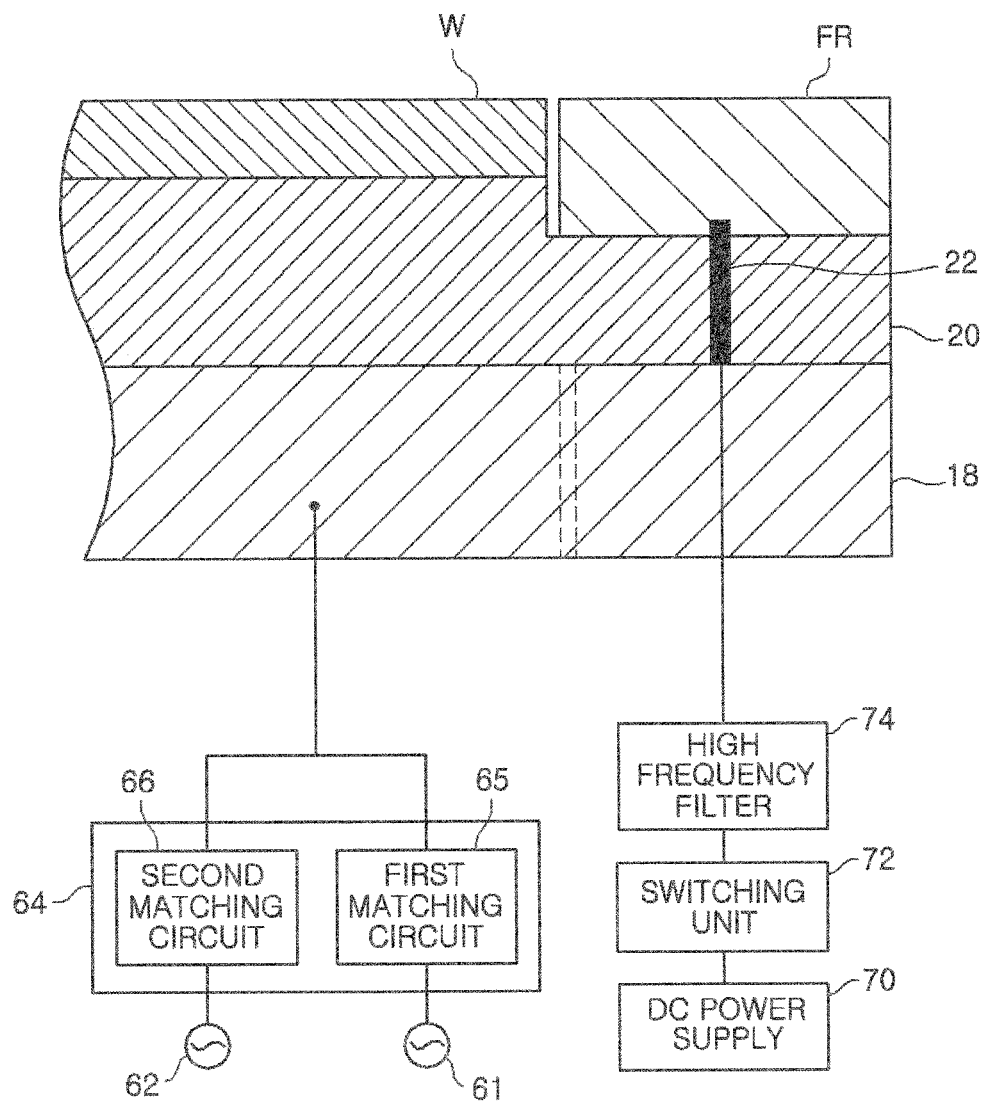
FIG. 9 shows another embodiment related to electrical connection between the focus ring and the DC power supply.

FIG. 9 shows another embodiment related to electrical connection between the focus ring and the DC power supply. As shown in FIG. 9, the focus ring FR may be connected to the DC power supply 70 through the conductor 22, the high-frequency filter 74, and the switching unit 72 without passing through the lower electrode 18. In this embodiment, the conductor 22 is electrically insulated from the lower electrode 18. Further, the lower electrode 18 and the electrode plate 21 may be electrically separated into a region below the substrate W, i.e., a central region, and a region below the focus ring FR, i.e., an outer peripheral region. In other words, the lower electrode 18 and the electrode plate 21 may form the central region and the outer peripheral region, and the central region and the outer peripheral region may be electrically insulated from each other. In this case, the high frequency power supply is connected to the central region and the measuring device 76 is configured to measure the self-bias voltage of the central region.

Figure 10:
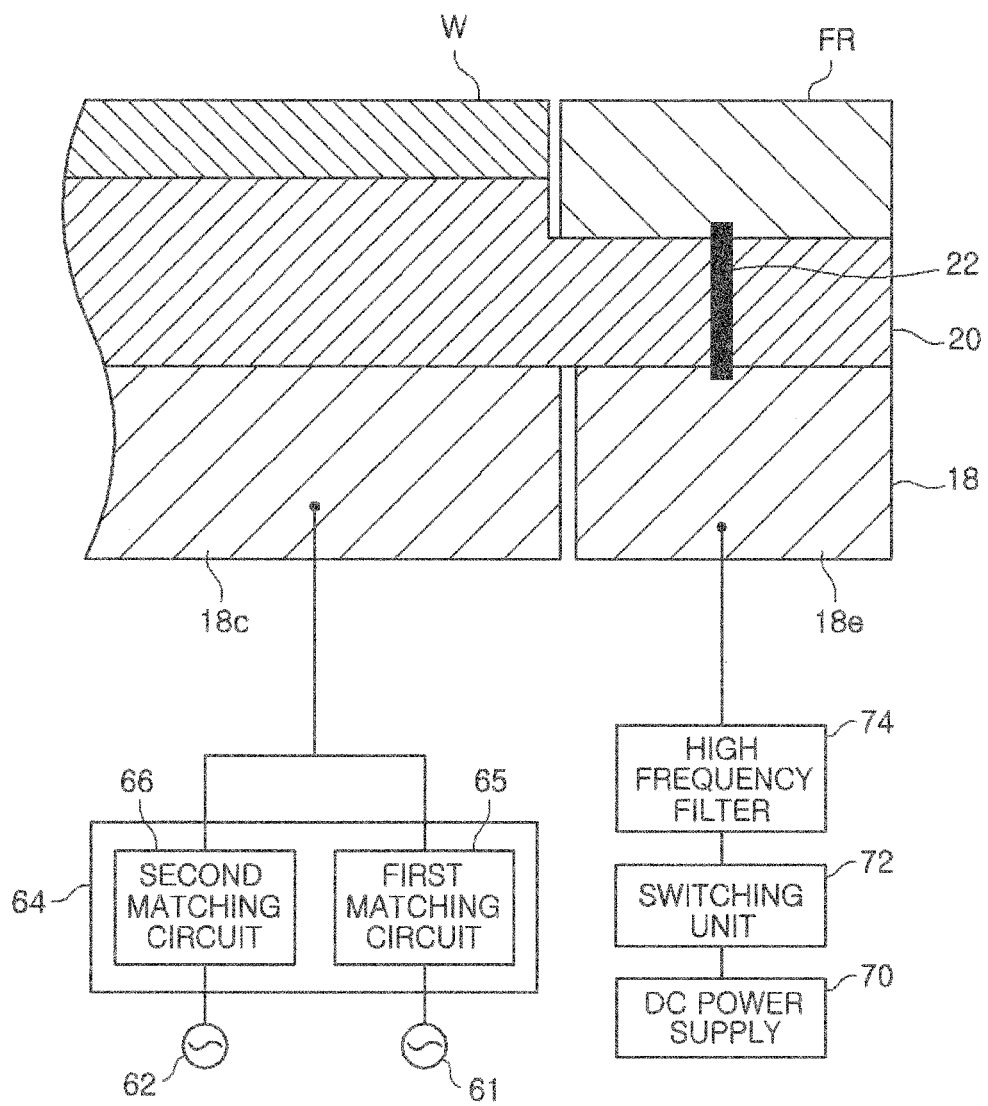
FIG. 10 shows still another embodiment related to the electrical connection between the focus ring and the DC power supply.

FIG. 10 shows still another embodiment related to the electrical connection between the focus ring and the DC power supply. In the embodiment shown in FIG. 10, the lower electrode 18 has a central region 18c below the substrate W and an outer peripheral region 18e below the focus ring FR. The central region 18c and the peripheral region 18e are separated from each other, and thus are electrically insulated from each other. The focus ring FR is connected to the DC power supply 70 through the conductor 22, the outer peripheral region 18e, the high frequency filter 74, and the switching unit 72. In this embodiment, the electrode plate 21 is also separated into the central region connected to the central region 18c and the peripheral region connected to the peripheral region 18e and electrically isolated from the central region 18c. In this case, the high frequency power supply is connected to the central region 18c through the central region of the electrode plate 21, and the measuring device 76 is configured to measure the self-bias voltage of the central region 18c.

Figure 11:
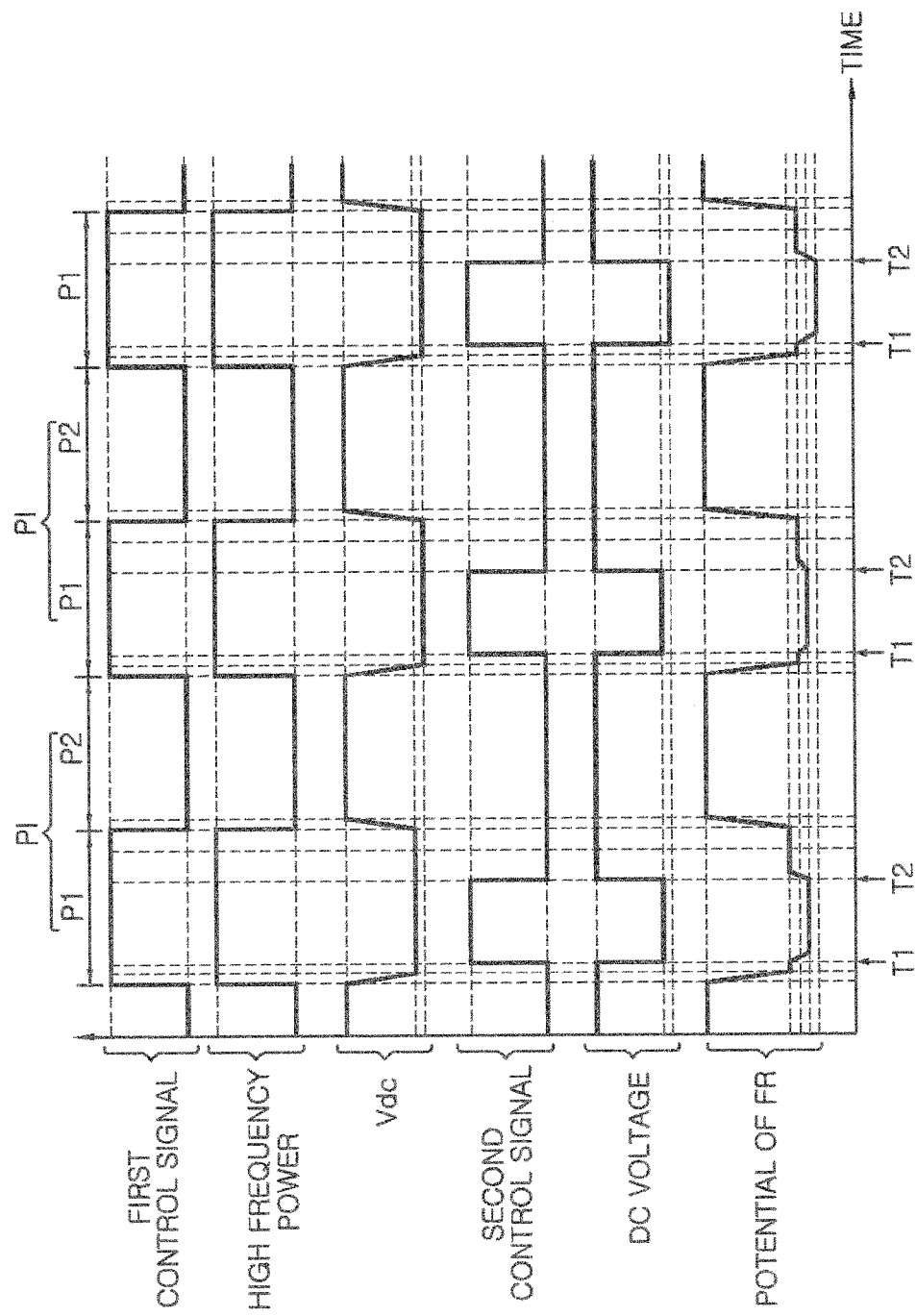
FIG. 11 is a timing chart related to plasma processing performed in plasma processing apparatuses according to various embodiments.

FIG. 11 is a timing chart related to plasma processing performed in the plasma processing apparatuses of various embodiments. A period of time in which the DC voltage generated by the DC power supply 70 is applied to the focus ring FR in the timing chart shown in FIG. 11 is different from the period of time in which the DC voltage generated by the DC power supply 70 is applied to the focus ring FR in the timing chart shown in FIG. 7. In other words, the controller PC may be configured to control the time (period of time) in which the DC voltage from the DC power supply 70 is applied to the focus ring FR within each first period P1 in order to correct the inclination of the incident direction of ions. For example, the controller PC may set the set value ΔV to a relatively high value and control the period of time in which the DC average voltage is applied to the focus ring FR to correct the temporal average of the incident angle of the ions in each period in which one or both of the high frequency powers are supplied.

Figure 12:
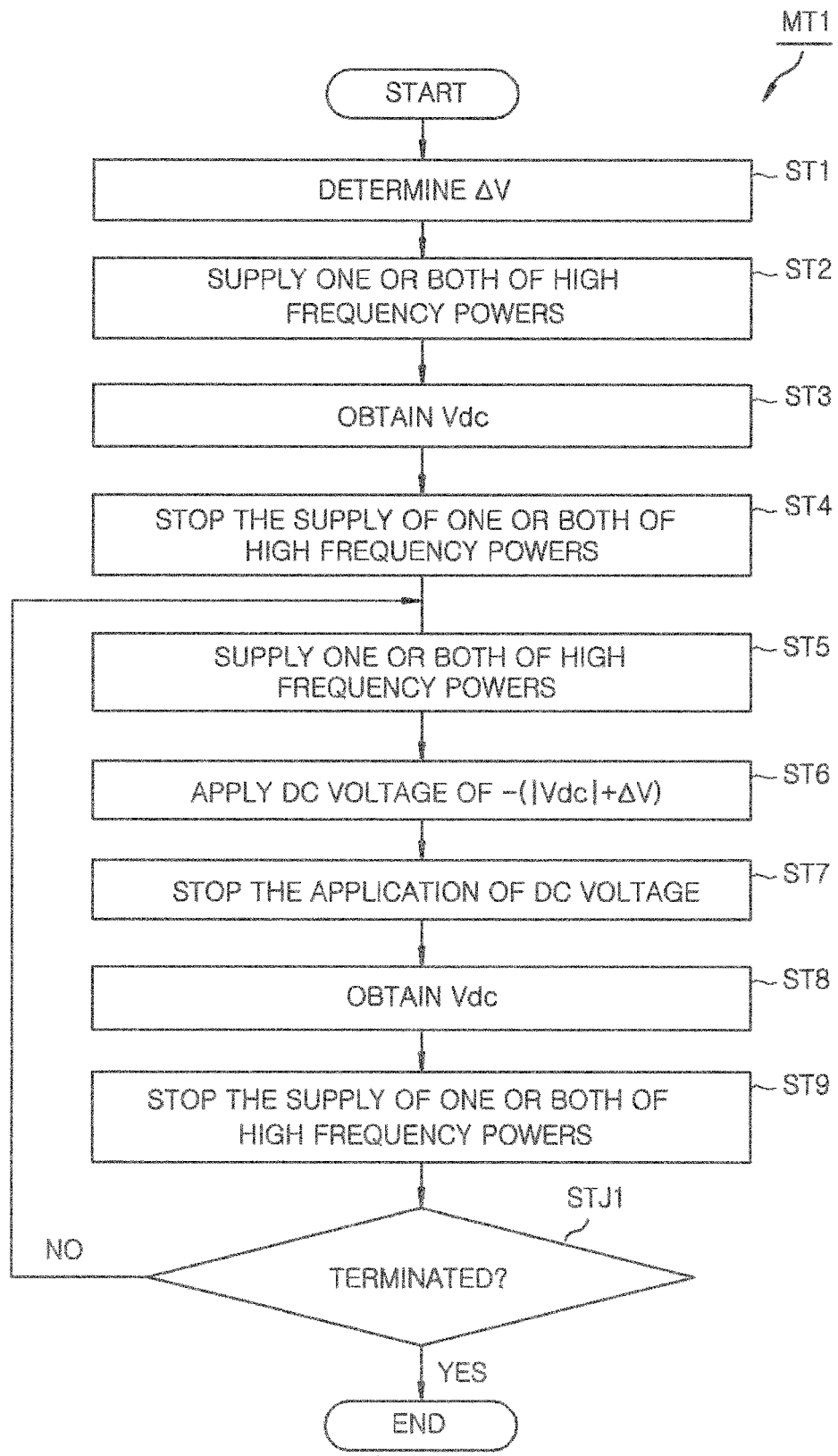
FIG. 12 is a flowchart showing a plasma processing method according to an embodiment.
Figure 13:
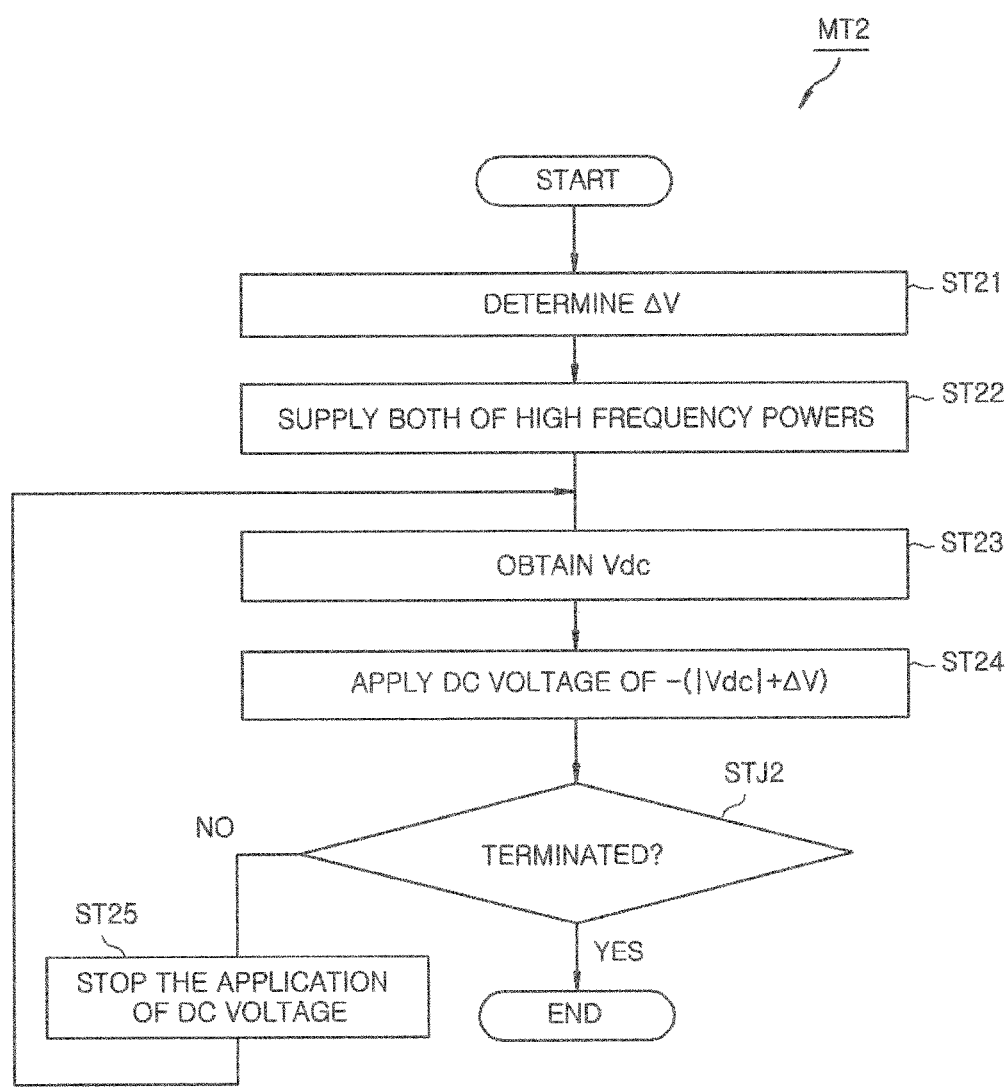
FIG. 13 is a flowchart showing a plasma processing method according to another embodiment.

Hereinafter, a plasma processing method according to an embodiment will be described. FIG. 12 is a flowchart showing a plasma processing method according to an embodiment. FIG. 13 is a flowchart showing a plasma processing method according to another embodiment. A plasma processing method MT1 shown in FIG. 12 and a plasma processing method MT2 shown in FIG. 13 can be performed by using any one of the plasma processing apparatuses of the above-described various embodiments. In the plasma processing method MT1 shown in FIG. 12, the supply of one of the first high frequency power and the second high frequency power is periodically stopped. In the plasma processing method MT2 shown in FIG. 13, both of the first high frequency power and the second high frequency power are continuously supplied during the plasma processing. In the plasma processing method MT2 shown in FIG. 13, the supply of one of the first high frequency power and the second high frequency power may be stopped continuously. In other words, one of the first high frequency power and the second high frequency power may not be used.

The plasma processing method MT1 is performed in a state in which the substrate W is mounted on the electrostatic chuck 20 and a processing gas is supplied into the chamber 12c. As shown in FIG. 12, the plasma processing method MT1 starts from a step ST1. In the step ST1, the set value ΔV is determined as described above. The set value ΔV can be determined by the main control unit MC. Specifically, the main control unit MC determines the set value ΔV from the amount of consumption of the focus ring FR and the self-bias voltage of the lower electrode 18 which is specified from the process conditions by using the predetermined function or table. It is also possible to mount the substrate W on the electrostatic chuck 20 and supply the processing gas into the chamber 12c after the step ST1 is executed.

Next, in a step ST2, one or both of the first high frequency power and the second high frequency power are supplied. The duration of the step ST2 corresponds to the first period P1. In the step ST2, plasma of the processing gas is generated, and the substrate W is processed by ions from the plasma. In the initial first period P1, the DC voltage from the DC power supply 70 is not applied to the focus ring FR. Next, a step ST3 is executed within the initial first period P1. In the step ST3, the self-bias voltage Vdc is measured by the measuring device 76.

Next, in a step ST4, the supply of one or both of the first high frequency power and the second high frequency power is stopped. In other words, the duration of the step ST4 corresponds to the initial second period P2.

Next, in a step ST5, as in the step ST1, one or both of the first high frequency power and the second high frequency power are supplied. The duration of the step ST5 corresponds to the first period P1. A step ST6 is executed within the duration of the step ST5, i.e., within the first period P1. The step ST6 starts at the first time T1. During the execution of the step ST6, the DC voltage from the DC power supply 70 is applied to the focus ring FR. The value of the DC voltage applied to the focus ring FR is −(|Vdc|+ΔV). |Vdc| is an absolute value of the self-bias voltage Vdc measured by the measuring device 76 immediately before the step ST6, and ΔV is the set value determined in the step ST1.

Next, in a step ST7, the application of the DC voltage from the DC power supply 70 to the focus ring FR is stopped. The step ST7 starts at the second time T2. Next, in a step ST8, the self-bias voltage Vdc within the third transition period PT3 is measured by the measuring device 76 as described above.

Next, in a step ST9, the supply of one or both of the first high frequency power and the second high frequency power is stopped. In the plasma processing method MT1, the steps ST5 and ST9 are executed alternately. The duration of the step ST9 corresponds to the second period P2.

Next, in a step STJ1, it is determined whether or not the plasma processing method MT1 is terminated. When the plasma processing method MT1 is not terminated, the processes from the step ST5 are repeated again. The plasma processing method MT1 is terminated when it is determined in step STJ1 that the number of executions of the sequence including the steps ST5 to ST9 has reached a predetermined number.

The plasma processing method MT2 shown in FIG. 13 is performed in a state where the substrate W is mounted on the electrostatic chuck 20 and the processing gas is supplied into the chamber 12c. As shown in FIG. 13, the plasma processing method MT2 starts from a step ST21. In the step ST21, as in the step ST1, the set value ΔV is determined. It is also possible to mount the substrate W on the electrostatic chuck 20 and supply the processing gas into the chamber 12c after the step ST21 is executed.

Next, in a step ST22, both of the high frequency powers, i.e., the first high frequency power and the second high frequency power, are supplied. In the step ST22, plasma of the processing gas is generated, and the substrate W is processed by ions from the plasma.

Next, in a step ST23, the self-bias voltage Vdc is measured by the measuring device 76. Next, in a step ST24, the DC voltage from the DC power supply 70 is applied to the focus ring FR. The value of the DC voltage applied to the focus ring FR is −(|Vdc|+ΔV). |Vdc| is an absolute value of the self-bias voltage Vdc measured by the measuring device 76 immediately before the step ST24, and ΔV is the set value determined in the step ST21.

Next, in a step STJ2, it is determined whether or not the plasma processing method MT2 is terminated. When the plasma processing method MT2 is not terminated, a step ST25 is executed. In the step ST25, the application of the DC voltage from the DC power supply 70 to the focus ring FR is stopped. Then, the processes from the step ST23 are repeated. The plasma processing method MT2 is terminated when it is determined in the step STJ2 that the duration of the step ST 22 has reached a predetermined period of time. While various embodiments have been described above, various modifications can be made without being limited to the above-described embodiments. For example, the plasma processing apparatus according to the above-described various embodiments is a capacitively coupled plasma processing apparatus. The plasma processing apparatus in the modification may be an inductively coupled plasma processing apparatus.

In the above-described various embodiments, the application of the DC voltage from the DC power supply 70 to the focus ring FR is stopped at the second time T2 within each first period P1. However, the application of the DC voltage from the DC power supply 70 to the focus ring FR may be stopped at the start point of the second period P2.

While the present disclosure has been shown and described with respect to the embodiments, it will be understood by those skilled in the art that various changes and modifications may be made without departing from the scope of the present disclosure as defined in the following claims.

What is claimed is:

1. A plasma processing apparatus comprising:
a chamber main body defining a chamber;
a stage, provided in the chamber, including a lower electrode and an electrostatic chuck provided on the lower electrode, on which a focus ring is arranged to surround a substrate mounted on the electrostatic chuck;
a first high frequency power supply configured to supply a first high frequency power for generating plasma of a gas in the chamber;
a second high frequency power supply configured to supply a second high frequency power for ion attraction to the lower electrode;
a DC power supply configured to generate a negative DC voltage to be applied to the focus ring in order to correct inclination of an incident direction of ions to an edge region of the substrate mounted on the electrostatic chuck with respect to a vertical direction;
a switching unit configured to stop the application of the DC voltage to the focus ring; and
a controller configured to control one or both of the high frequency power supply and the second high frequency power supply and control the switching unit,
wherein the controller controls one or both of the first high frequency power supply and the second high frequency power supply to periodically stop the supply of one or both of the first high frequency power and the second high frequency power, and
the controller also controls the switching unit to apply the DC voltage to the focus ring from a first time after a predetermined period of time in which a self-bias voltage of the lower electrode is decreased from a start point of each period in which one or both of the first high frequency power and the second high frequency power are supplied and to stop the application of the DC voltage to the focus ring during each period in which the supply of one or both of the first high frequency power and the second high frequency power is stopped.

2. The plasma processing apparatus of claim 1, wherein the controller controls the switching unit to stop the application of the DC voltage to the focus ring at a second time earlier than an end point of each period in which one or both of the first high frequency power and the second high frequency power are supplied.

3. The plasma processing apparatus of claim 2, further comprising:
a main control unit; and
a measuring device configured to measure the self-bias voltage of the lower electrode;
wherein the DC power supply is configured to generate the DC voltage whose absolute value is a sum of an absolute value of the self-bias voltage measured by the measuring device and a set value designated by the main control unit, and
the main control unit is configured to determine the set value from the self-bias voltage of the lower electrode specified from a processing condition and an amount of consumption of the focus ring by using a predetermined function or table.

4. The plasma processing apparatus of claim 3, wherein the DC power supply is configured to obtain the self-bias voltage measured by the measuring device between the second time and the end point in each period in which one or both of the first high frequency power and the second high frequency power are supplied and to generate the DC voltage whose absolute value is the sum of the set value and an absolute value of the measured self-bias voltage in a next period in which one or both of the first high frequency power and the second high frequency power are supplied.

5. The plasma processing apparatus of claim 1, wherein the controller is configured to control a duration of applying the DC voltage to the focus ring in each period in which one or both of the first high frequency power and the second high frequency power are supplied in order to correct the inclination.

6. A plasma processing method performed by using a plasma processing apparatus comprising a chamber main body defining a chamber; a stage, provided in the chamber, including a lower electrode and an electrostatic chuck provided on the lower electrode, on which a focus ring is arranged to surround a substrate mounted on the electrostatic chuck; a first high frequency power supply configured to supply a first high frequency power for generating plasma of a gas in the chamber; a second high frequency power supply configured to supply a second high frequency power for ion attraction to the lower electrode; a DC power supply configured to generate a negative DC voltage to be applied to the focus ring in order to correct inclination of an incident direction of ions to an edge region of the substrate mounted on the electrostatic chuck with respect to a vertical direction; a switching unit configured to stop the application of the DC voltage to the focus ring; and a controller configured to control one or both of the high frequency power supply and the second high frequency power supply and control the switching unit, the method comprising:

supplying one or both of the first high frequency power and the second high frequency power; and stopping the supply of one or both of the first high frequency power and the second high frequency power, wherein said supplying one or both of the first high frequency power and the second high frequency power and said stopping the supply of one or both of the first high frequency power and the second high frequency power are alternately executed, the method further comprising:

applying the DC voltage to the focus ring from a first time after a predetermined period of time in which a self-bias voltage of the lower electrode is decreased from a start point of each period in which one or both of the first high frequency power and the second high frequency power are supplied; and stopping the application of the DC voltage to the focus ring during each period in which the supply of one or both of the first high frequency power and the second high frequency power is stopped.

7. The plasma processing method of claim 6, wherein said stopping the application of the DC voltage starts at a second time earlier than an end point of each period in which one or both of the first high frequency power and the second high frequency power are supplied.

8. The plasma processing method of claim 7, wherein the plasma processing apparatus further includes:

a main control unit; and a measuring device configured to measure the self-bias voltage of the lower electrode, wherein the main control unit is configured to determine a set value from the self-bias voltage of the lower electrode specified from a process condition and an amount of consumption of the focus ring by using a predetermined function or table, and wherein in said applying the DC voltage, the DC voltage whose absolute value is a sum of the set value determined by the main control unit and an absolute value of the self-bias voltage measured by the measuring device is applied to the focus ring.

9. The plasma processing method of claim 8, wherein the self-bias voltage measured by the measuring device between the second time and the end point in each period in which one or both of the first high frequency power and the second high frequency power are supplied is obtained, and the DC voltage whose absolute value is the sum of the set value and an absolute value of the measured self-bias voltage is applied to the focus ring in a next period in which one or both of the first high frequency power and the second high frequency power are supplied.

10. A plasma processing method performed by using a plasma processing apparatus comprising a chamber main body defining a chamber; a stage, provided in the chamber, including a lower electrode and an electrostatic chuck provided on the lower electrode, on which a focus ring is arranged to surround a substrate mounted on the electrostatic chuck; a first high frequency power supply configured to supply a first high frequency power for generating plasma of a gas in the chamber; a second high frequency power supply configured to supply a second high frequency power for ion attraction to the lower electrode; a DC power supply configured to generate a negative DC voltage to be applied to the focus ring in order to correct inclination of an incident direction of ions to an edge region of the substrate mounted on the electrostatic chuck with respect to a vertical direction; a switching unit configured to stop the application of the DC voltage to the focus ring; and a controller configured to control one or both of the high frequency power supply and the second high frequency power supply and control the switching unit, the method comprising:

supplying one or both of the first high frequency power and the second high frequency power, and applying the DC voltage to the focus ring from a first time after a predetermined period of time in which a self-bias voltage of the lower electrode is decreased from a start point of a period in which one or both of the first high frequency power and the second high frequency power are supplied.

11. The plasma processing method of claim 10, wherein the method further comprises stopping the application of the DC voltage to the focus ring.

12. The plasma processing method of claim 11, wherein the plasma processing apparatus further includes:

a main control unit; and a measuring device configured to measure the self-bias voltage of the lower electrode, wherein the main control unit is configured to determine a set value from the self-bias voltage of the lower electrode specified from a process condition and an amount of consumption of the focus ring by using a predetermined function or table, and wherein in said applying the DC voltage, the DC voltage whose absolute value is a sum of the set value determined by the main control unit and an absolute value of the self-bias voltage measured by the measuring device is applied to the focus ring.

* * * * *